(12) United States Patent
Kim et al.

(10) Patent No.: US 8,089,860 B2
(45) Date of Patent: Jan. 3, 2012

(54) DATA TRANSMISSION SYSTEM AND METHOD

(75) Inventors: Jong-Hoon Kim, Hwaseong-si (KR);
Jae-Jun Lee, Seongnam-si (KR);
Kwang-Soo Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 945 days.

(21) Appl. No.: 11/708,557

(22) Filed: Feb. 21, 2007

(65) Prior Publication Data

US 2008/0056345 A1 Mar. 6, 2008

(30) Foreign Application Priority Data

Aug. 29, 2006 (KR) ................ 10-2006-0082390

(51) Int. Cl.
*H04J 7/00* (2006.01)
(52) U.S. Cl. ............... 370/212; 370/466; 709/247
(58) Field of Classification Search .......... 370/212; 375/238
See application file for complete search history.

(56) References Cited

U.S. PATENT DOCUMENTS

| | | | |
|---|---|---|---|
| 6,198,717 B1 | 3/2001 | Bailey | |
| 6,810,007 B1 * | 10/2004 | Kim | 370/208 |
| 2004/0105497 A1 | 6/2004 | Takakura et al. | |
| 2004/0130467 A1 | 7/2004 | Nakagawa et al. | |
| 2005/0286643 A1 | 12/2005 | Ozawa et al. | |
| 2007/0018870 A1 * | 1/2007 | Hayami | 341/143 |
| 2007/0083746 A1 * | 4/2007 | Fallon et al. | 713/1 |
| 2007/0204202 A1 * | 8/2007 | Kobayashi et al. | 714/769 |
| 2009/0312961 A1 * | 12/2009 | Hovis et al. | 702/42 |

FOREIGN PATENT DOCUMENTS

KR 1020020011981 A 2/2002

* cited by examiner

*Primary Examiner* — Pao Sinkantarakorn
(74) *Attorney, Agent, or Firm* — Volentine & Whitt, PLLC

(57) ABSTRACT

Data transmission system and method are provided. The transmission system includes a data converter and data restoring unit. The data converter converts N-bit first data to be transmitted into M-bit second data, where M is greater than N and the second data is arranged in a minimum unit greater than 1, each minimum unit including at least successive data bits having the same phase. The transmitter compresses the second data prior to transmission via a channel having performance characteristics defining a minimum pulse width, and a receiver receives and de-compresses the transmitted second data. The data restoring unit then restores the first data from the second.

8 Claims, 9 Drawing Sheets

FIG. 3

| OF DATA (4bit) | | | | | TF DATA (7bit) | | | | | | |
|---|---|---|---|---|---|---|---|---|---|---|---|
| a | b | c | d | | e | f | g | h | i | j | k |
| 0 | 0 | 0 | 0 | → | 0 | 0 | 0 | 0 | 0 | 0 | 0 |
| 0 | 0 | 0 | 1 | → | 0 | 0 | 0 | 0 | 0 | 1 | 1 |
| 0 | 0 | 1 | 0 | → | 0 | 0 | 0 | 0 | 1 | 1 | 1 |
| 0 | 0 | 1 | 1 | → | 0 | 0 | 0 | 1 | 1 | 0 | 0 |
| 0 | 1 | 0 | 0 | → | 0 | 0 | 0 | 1 | 1 | 1 | 1 |
| 0 | 1 | 0 | 1 | → | 0 | 0 | 1 | 1 | 0 | 0 | 0 |
| 0 | 1 | 1 | 0 | → | 0 | 0 | 1 | 1 | 1 | 0 | 0 |
| 0 | 1 | 1 | 1 | → | 0 | 0 | 1 | 1 | 1 | 1 | 1 |
| 1 | 0 | 0 | 0 | → | 1 | 1 | 0 | 0 | 0 | 0 | 0 |
| 1 | 0 | 0 | 1 | → | 1 | 1 | 0 | 0 | 0 | 1 | 1 |
| 1 | 0 | 1 | 0 | → | 1 | 1 | 0 | 0 | 1 | 1 | 1 |
| 1 | 0 | 1 | 1 | → | 1 | 1 | 1 | 0 | 0 | 0 | 0 |
| 1 | 1 | 0 | 0 | → | 1 | 1 | 1 | 0 | 0 | 1 | 1 |
| 1 | 1 | 0 | 1 | → | 1 | 1 | 1 | 1 | 0 | 0 | 0 |
| 1 | 1 | 1 | 0 | → | 1 | 1 | 1 | 1 | 1 | 0 | 0 |
| 1 | 1 | 1 | 1 | → | 1 | 1 | 1 | 1 | 1 | 1 | 1 |

FIG. 6

| q | NAC(q) | $2^p$ | p |
|---|---|---|---|
| 4 | 4 | 4 | 2 |
| 5 | 6 | 4 | 2 |
| 6 | 10 | 8 | 3 |
| 7 | 16 | 16 | 4 |
| 8 | 26 | 16 | 4 |
| 9 | 42 | 32 | 5 |
| 10 | 68 | 64 | 6 |
| 11 | 110 | 64 | 6 |
| 12 | 178 | 128 | 7 |
| 13 | 288 | 256 | 8 |
| 14 | 466 | 256 | 8 |
| 15 | 754 | 512 | 9 |
| 16 | 1,220 | 1,024 | 10 |
| 17 | 1,974 | 1,024 | 10 |
| 18 | 3,194 | 2,048 | 11 |
| 19 | 5,168 | 4,096 | 12 |
| 20 | 8,362 | 8,192 | 13 |
| 21 | 13,530 | 8,192 | 13 |
| 22 | 21,892 | 16,384 | 14 |
| 23 | 35,422 | 32,768 | 15 |
| 24 | 57,314 | 32,768 | 15 |
| 25 | 92,736 | 65,536 | 16 |
| 26 | 150,050 | 131,072 | 17 |
| 27 | 242,786 | 131,072 | 17 |
| 28 | 392,836 | 262,144 | 18 |
| 29 | 635,622 | 524,288 | 19 |
| 30 | 1,028,458 | 524,288 | 19 |
| 31 | 1,664,080 | 1,048,576 | 20 |
| 32 | 2,692,538 | 2,097,152 | 21 |
| 33 | 4,356,618 | 4,194,304 | 22 |
| 34 | 7,049,156 | 4,194,304 | 22 |
| 35 | 11,405,774 | 8,388,608 | 23 |
| 36 | 18,454,930 | 16,777,216 | 24 |
| 37 | 29,860,704 | 16,777,216 | 24 |
| 38 | 48,315,634 | 33,554,432 | 25 |
| 39 | 78,176,338 | 67,108,864 | 26 |
| 40 | 126,491,972 | 67,108,864 | 26 |
| 41 | 204,668,310 | 134,217,728 | 27 |
| 42 | 331,160,282 | 268,435,456 | 28 |
| 43 | 535,828,592 | 268,435,456 | 28 |
| 44 | 866,988,874 | 536,870,912 | 29 |
| 45 | 1,402,817,466 | 1,073,741,824 | 30 |
| 46 | 2,269,806,340 | 2,147,483,648 | 31 |
| 47 | 3,672,623,806 | 2,147,483,648 | 31 |
| 48 | 5,942,430,146 | 4,294,967,296 | 32 |

FIG. 7

| BEFORE CONVERSION | AFTER CONVERSION | | TIME SHORTENING | DATA RATE INCREASE RATE |
|---|---|---|---|---|
| 4 | → | 7/2 | 87.500% | 12.500% | 14.3% |
| 8 | → | 13/2 | 81.250% | 18.750% | 23.1% |
| 16 | → | 25/2 | 78.125% | 21.875% | 28.0% |
| 32 | → | 48/2 | 75.000% | 25.000% | 33.3% |

FIG. 8

| BEFORE CONVERSION | | AFTER CONVERSION | TIME SHORTENING | DATA RATE INCREASE RATE |
|---|---|---|---|---|
| 4 | → | 10/3 | 83.333% | 16.667% | 20.0% |
| 8 | → | 17/3 | 70.833% | 29.167% | 41.2% |
| 16 | → | 32/3 | 66.667% | 33.333% | 50.0% |
| 32 | → | 61/3 | 63.542% | 36.458% | 57.4% |

FIG. 9

| BEFORE CONVERSION | | AFTER CONVERSION | TIME SHORTENING | DATA RATE INCREASE RATE |
|---|---|---|---|---|
| 4 | → | 13/4 | 18.750% | 23.077% |
| 8 | → | 21/4 | 34.375% | 52.381% |
| 16 | → | 39/4 | 39.063% | 64.103% |
| 32 | → | 73/4 | 42.969% | 75.342% |

DATA TRANSMISSION SYSTEM AND METHOD

BACKGROUND OF THE INVENTION

1. Technical Field

The present invention relates to data transmission systems and methods. More particularly, the invention relates to a data transmission system and method capable of reducing data transmission time.

This application claims priority under 35 U.S.C. §119 from Korean Patent Application 10-2006-0082390, filed on Aug. 29, 2006, the subject matter of which is hereby incorporated by reference.

2. Description of Related Art

Contemporary data transmission systems are increasingly designed to operate at higher speeds and greater data precision. Significant efforts have been expended to reduce the frequency of data errors while system run at ever faster data transmission rates.

Figure (FIG.) 1 illustrates one example of a conventional data transmission system. Referring to FIG. 1, data transmission system 10 generally includes a driver 12, a channel 14 and a receiver 16. Driver 12 is a circuit receiving input data having a specified bit rate (pbit) and generating transmission data. Channel 14 is a transmission path for the transmission data and potentially includes electrical, optical, and Radio Frequency (RF) portions. Receiver 16 is a circuit receiving the transmission data from channel 14 and generating output data have the specified bit rate (pbit).

In the conventional data transmission system, a minimum pulse width (MPW) parameter defines a smallest data transmission period during which a defined data component (e.g., a bit, byte or block of data) may be transmitted with an acceptable signal to noise ratio through channel 14. The MPW determines in large measure the maximum data transmission rate (often defined as 1/MPW and expressed in terms of bits per second) supported by the data transmission system, and channel 14 in particular. Thus, a MPW of 500 picoseconds (ps) defined a maximum data transmission rate of 2 Giga bytes per second (Gbps).

Often the MPW of a data transmission system is a fixed by the physical characteristics of channel 14. Thus, many conventional data transmission systems attempt to increase data transmissions speed by increasing the performance of driver 12 and/or receiver 16. There are many ways to improve performance, including the use of an equalizer, data pre-emphasis/de-emphasis, etc. Such performance enhancing techniques notwithstanding, the inherent limitations of channel 14 frequently preclude material expansions in the maximum obtainable data transmission rate. Indeed, the maximum obtainable data transmission rate remains substantially limited to 1/MPW.

There exists a continuing need for increased data transmission rates in excess of the 1/MPW limit. In order to obtain such increased data transmission speeds, a new approach is required.

SUMMARY OF THE INVENTION

Embodiments of the invention provide a data transmission system and method through which faster data transmission speeds may be obtained. Indeed, given a defined volume of data to be transmitted, transmitter (driver)/receiver/channel performance, and an acceptable signal to noise ratio, embodiments of the invention are able to increase effective data transmission rates above the inverse of a minimum pulse width defined by the channel response. Further, relative power consumption per data block transmitted may be reduced. Relatively more data may thus be transmitted during a defined period of time.

Embodiments of the invention also allow the addition of data to a command signal or error correction code signal transmitted with the transmission data.

In one embodiment, the invention provides a data transmission system, comprising; a data converter converting N-bit first data to be transmitted into M-bit second data, wherein M is greater than N and the second data is arranged in a minimum unit greater than 1, each minimum unit including at least successive data bits having the same phase, a transmitter compressing the second data prior to transmission via a channel having performance characteristics defining a minimum pulse width, a receiver receiving and de-compressing the transmitted second data; and a data restoring unit receiving the second data from the receiver and restoring the first data from the second.

In another embodiment, the invention provides a data transmission method comprising; converting N-bit first data to be transmitted via the channel into M-bit second data, wherein M is greater than N and the second data is arranged in a minimum unit greater than 1, each minimum unit including at least successive data bits having the same phase, compressing the second data in the transmitter, transmitting the compressed second data via the channel having performance characteristics defining a minimum pulse width, receiving and de-compressing the transmitted second data in the receiver, and restoring the first data from the de-compressed second data.

BRIEF DESCRIPTION OF THE DRAWINGS

FIGS. 3 and 4 are data tables illustrating a relationship between first data constructed of 4 bit signals and second data having a minimum unit of two (2);

FIG. 6 is a data table illustrating a bit number relationship between first and second data, where the second data has a minimum unit of two (2); and FIGS. 7 through 9 illustrate comparative data rates and transmission speeds for the illustrated relationships above.

DESCRIPTION OF EMBODIMENTS

Embodiments of the present invention now will be described in some additional detail with reference to FIGS. 2 through 9. However, the invention may be variously embodied and should not be construed as being limited to only the embodiments set forth herein. Rather, these embodiments are presented as teaching examples.

Figure 1:
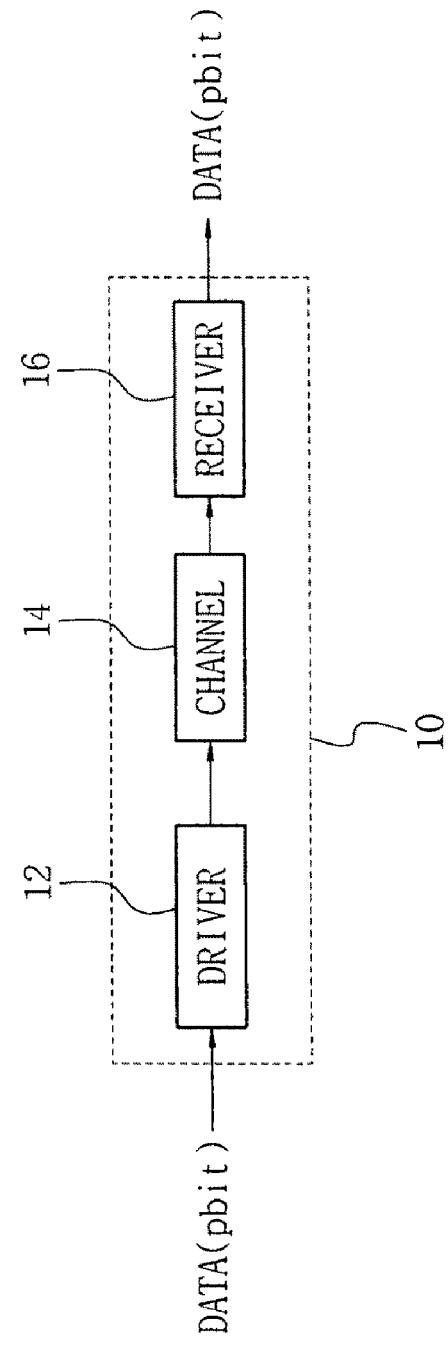
FIG. 1 is a block diagram of a conventional data transmission system.
Figure 2:
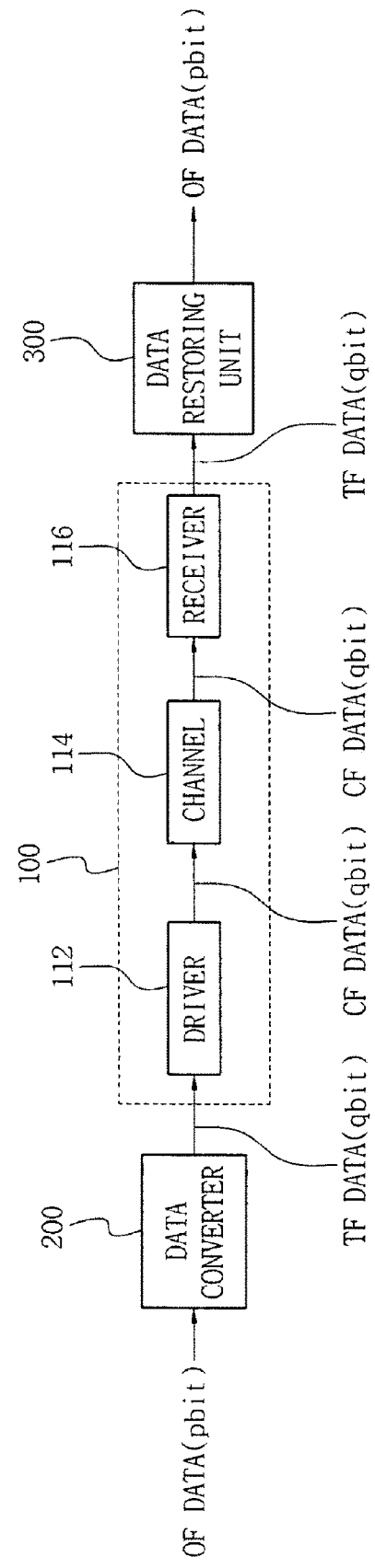
FIG. 2 is a block diagram of data transmission system according to an embodiment of the invention.

FIG. 2 is a block diagram of an improved data transmission system according to an embodiment of the invention. As shown in FIG. 2, the improved data transmission system includes; a data converter 200, a data transmission system 100, and a data restoring unit 300. In the illustrated example of FIG. 2, data transmission system 100 may be conventional in its composition. In such an embodiment, data converter 200 and data restoring unit 300 may be added onto the conventional data transmission system 100. Those of ordinary skill in the art will therefore appreciate that performance characteristics associated with channel 14 will be fixed within this type of embodiment. Alternately, data converter 200 may be functionally incorporated into driver 112 and data restoring unit 300 may be functionally incorporated in receiver 116 to provide the advantages of the invention.

Data converter 200 is configured to convert data to be transmitted and having a "first data" form (OF DATA) into a "second data" form (TF DATA). The first data is assumed to have a digital form defined in part by a phase component.

At least one bit of first data is converted into second data such that at least two successive bits of second data having the same phase. That is, second data is characterized by at least two successive bits having the same phase. Thus, the second data is constructed of at least one transmission group having at least two successive same-phase bits. The "at least two successive same-phase bits" will be referred to hereafter as a "minimum unit".

For example, assuming a first data constructed of 4-bit data—0 1 0 1, corresponding second data, as converted from the first data, may be constructed of 7-bit data—0 0 1 1 0 0 0. In this example, the second data is configured so as not to include a lone bit of same type or phase (1 or 0) according to the foregoing minimum unit rule, wherein no less than two successive bits of similar phase may be apparent in the second data. (The working example assumes that data value and phase are correlated 1 for 1 for ease of explanation. Those of ordinary skill in the art will however recognize that this need not be the case where data type (or values of 1 and 0) translate into multiple phases). In the illustrated example, the second data is constructed of three "transmission groups" including two of minimum unit size (e.g., '0 0', '1 1', and '0 0 0').

In another embodiment of the invention, a minimum unit of three (3) or more may be assigned. Assuming a minimum unit of three (3) and the first data example above, corresponding second data may be constructed of 10-bit data—0 0 0 1 1 1 0 0 0 0. In this example, the second data is constructed of three transmission groups (e.g., '0 0 0', '1 1 1', and '0 0 0 0').

The use and implementation of data converter 200 will now be described in some additional detail with reference to FIGS. 3 through 9. Data transmission system 100 is assumed to be capable of compressing the second data during its transmission through channel 14. Thus, data transmission system 100 will compress data bits in relation to minimum unit groupings of the data, and thereafter transmit a corresponding data signal at a speed defined by the MPW associated with channel 14.

Data transmission system 100 includes a driver 112, a transmission channel 114, and a receiver 116.

Driver 112 or a circuit associated with driver 112 will typically compress the second data received from data converter 200. The second data is compressed such that at least the number of data bits forming a minimum unit may be transmitted within a time period corresponding to a single minimum pulse width. The data bits forming each minimum unit will have the same phase (and in the illustrated examples the same data value). Thus, the data compression function may be controlled in relation to the operating frequency of driver 112. For example, assuming a minimum unit size of two (2), the second data may be compressed by a factor of two (2×) by increasing the data transmission frequency of driver 112 over the conventional driver. Thus, the resulting compressed data (CF DATA) contains two bits of information per time period defined in relation to the MPW. Similarly, the compressed data would contain three bits of information per MPW where the minimum unit is three (3). Various data compression techniques may be used, as is conventionally understood.

Receiver 116 receives the compressed data from channel 114 and conventionally de-compressed the data in order to provide the second data to data restoring unit 300.

Data restoring unit 300 mow restores the first data in its original form from the second data received from receiver 116. The data restoring operation performed by data restoring unit 300 essentially reverses the data conversion process performed by data converter 200 (e.g., the minimum unit, data grouping function).

Figure 4:
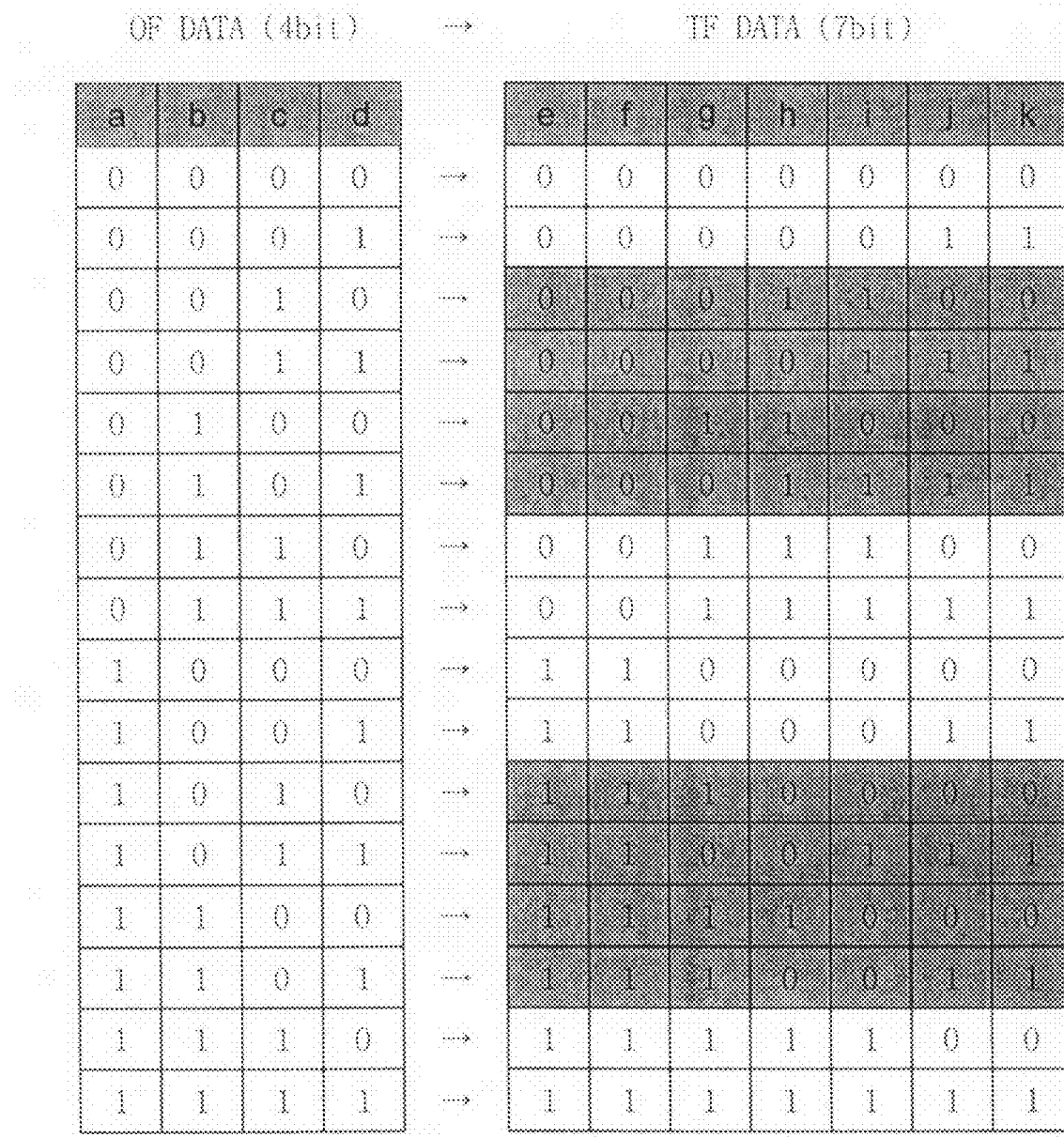

FIGS. 3 and 4 are data tables illustrating corresponding relationships between first data constructed of 4-bit data and second data having a minimum unit of two (2). This conversion/de-conversion relationship may be readily implemented in a Digital Signal Processor (DSP), Application Specific Integrated Circuit (ASIC), microprocessor, or hardwired logic gates within data converter 200 and/or data restoring unit 300. Further, such functionality may be implemented in software, hardware and/or firmware.

As shown in FIGS. 3 and 4, the first data having a 4-bit structure of 'a b c d' (or $2^4$=16 unique data byte values) is well known. Thus, the corresponding second data, as converted from the first data, will have more than 16 unique data byte values. Thus, the number of data bits used to express the second data will be greater than the number of data bits used to express the first data. In other words, the second data which has a minimum unit of two (2), rather than a minimum unit of one (1) as in the first data, requires a greater number of data bits to properly express all possible data combinations.

As described above, when the first data constructed of 4-bit data and converted to second data having a minimum unit of two (2), the second data may be faithfully constructed using 7-bit data. However, if the minimum unit size is different, the number of bits used to express the second data must change accordingly. For a minimum unit of three (3), for example, the second data may be constructed of 10-bit data.

As shown in FIGS. 3 and 4, the first data constructed of 4-bit data ('a b c d') uniquely converts into 16 sets of corresponding second data constructed of 7-bits ('e f g h I j k'). There are numerous methods for accomplishing this first-to-second data conversion, as will be appreciated by those of ordinary skill in the art. For example, where the first data is '0 0 1 0', it may be converted into second data of '0 0 0 0 1 1 1' as shown in FIG. 3, or into second data of '0 0 0 1 1 0 0' as shown in FIG. 4.

Where the first data and second data have the relationships shown in FIGS. 3 and 4, data converter 200 may be implemented using a Karnaugh Map—a technique understood by those skilled in the art. This technique will be further described below, as one example of data conversion which may be implemented in embodiments of the invention.

In the corresponding relation shown in FIG. 3, a conversion value from first data bits ('a b c d') to second data bits ('e f g h I j k') may be accomplished by defining the value as 'e=f=a', 'g=b·(a+c+d)+acd', 'h=b·(/a+c+d)+/acd', 'i=c·(/a+b+/d)+/ab/d', 'j=k=b−⊕−c−⊕−d'.

Thus, in one embodiment, data converter 200 can be realized by employing AND, OR, XOR circuits. The respective bits 'a b c d' are input and converted into respective bit signals of 'e f g h I j k' using only these simple logic circuits.

In one embodiment, the configuration of data converter 200 may be as follows:

Second data bits 'e' and 'f' may be defined from the first data bit 'a', so a corresponding converting circuit is not required, only a buffer circuit.

Second data bit 'g' may be defined as 'g=b·(a+c+d)+acd'. Thus, the corresponding converting circuit may be realized using a first and second OR circuits, and first and second AND circuits, wherein the first OR circuit receives the first data bits 'a', 'c' and 'd', the first AND circuit receives the output of the first OR circuit and the first data bit 'b', the second AND circuit receives the first data bits 'a', 'c' and 'd', and the second OR circuit receives the outputs of the first and second AND circuits. The specific conversion of second data bits 'h', 'i', 'j' and 'k' follow similarly according to the logical expression noted above.

The simple circuit composition of data converter 200, in all of its various permutations, allows it to run at high speed with relatively low power consumption. For example, in changing the corresponding first data-to-second data relationship shown in FIG. 3 to the relationship shown in FIG. 4, data converter 200 may yet be implemented in relatively simple circuits.

For example, where first data of '0 0 1 0' exists in relation to the relationship shown in FIG. 3, corresponding second data of '0 0 0 0 1 1 1' is obtained. However, where the same first data exists relative to the relationship shown in FIG. 4, corresponding second data of '0 0 0 1 1 0 0' is obtained. A configuration of simple logic circuits adapted to derive this relationship may be similar the foregoing. That is, the converting circuits for the 'j' and 'k' bits of the second data in the first working example (FIG. 3) are not necessary in the second working example (FIG. 4). Thus, the previously required XOR circuit may be replaced by a hardware connection of the 'd' bit line to the 'j' and 'k' bit lines.

Figure 5:
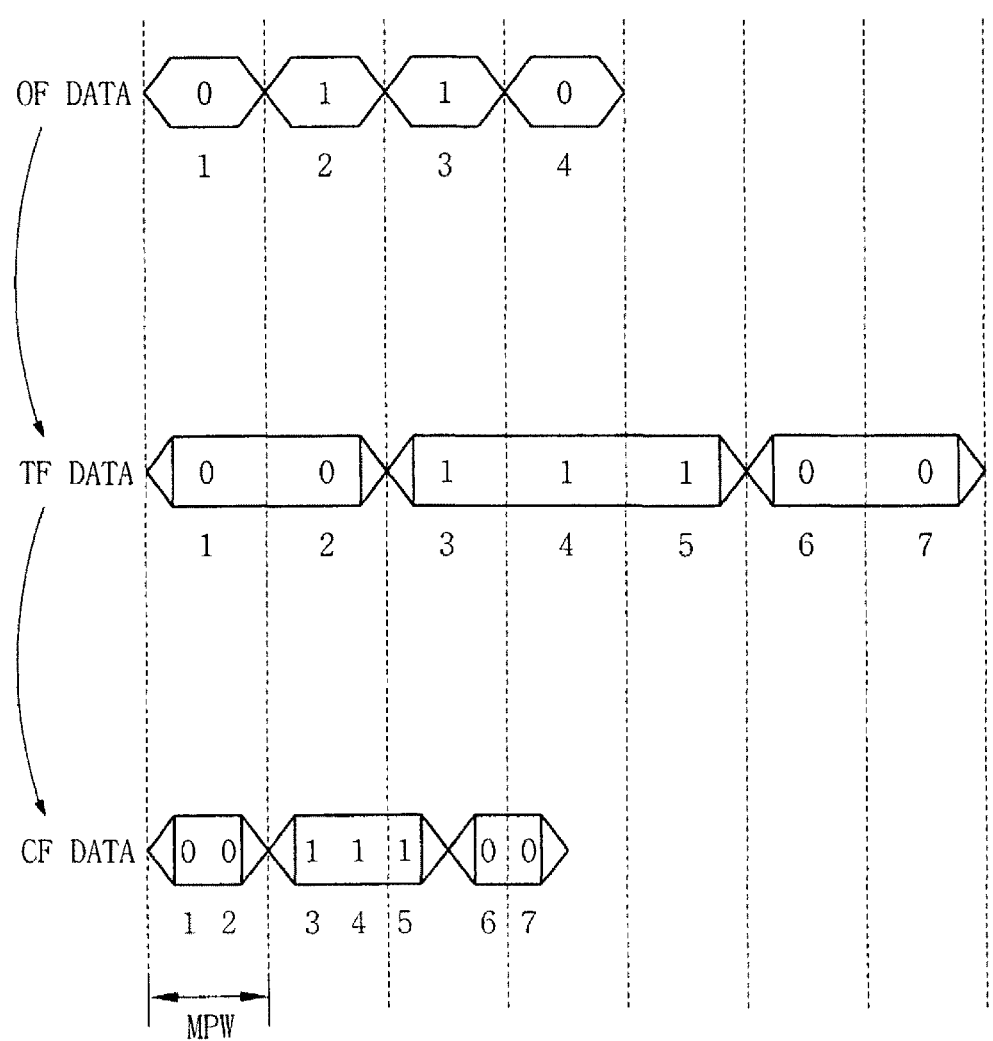
FIG. 5 further illustrates the data conversion and compression implicated in the relationship illustrated in FIG. 3.

FIG. 5 illustrates a data conversion and compression approach consistent with the exemplary relationship illustrated in FIG. 3.

As shown in FIG. 5, first data of '0 1 1 0' is assumed as an input to data converter 200. Data converter 200 generates second data of '0 0 1 1 1 0 0' in response to this first data input.

The second data is compressed prior to transmission, such that data bits forming groups of at least minimum unit size are transmitted during a time period ("T") corresponding to a MPW. As shown in FIG. 5, the effective transmission rate of data bots arranged in second data type is substantially increased by means of compression. In the illustrated example, a conventional transmission of the 4-bit first data requires a time period of 4 T. However, transmission of the compressed second data corresponding to the first data requires a time period of 3.5 T. Thus, the specific illustrated approach consistent with an embodiment of the invention saves 0.5 T of time over an initial 4 T expectation—a savings of 12.5%.

Further, conventional transmission of the first data may yield as many as three (3) logical data transitions (e.g., 1 to 0, or 0 to 1). Each one of these transitions requires a flip-flip circuit "toggle" that consumes power. However, transmission of the second data according to the illustrated embodiment of the invention only requires at most two (2) logical data transitions—a 33% power saving related to flip-flip use under worse case assumptions.

From another viewpoint, relatively more data bits may be transmitted during a defined transmission period. As a result, data bits associated with a command/control signal or error correction coding may be added to the data being transmitted during the defined transmission period without reduction in data throughput over the conventional approach. Thus, more robust data may be transmitted providing improve signal quality and greater reliability.

FIG. 6 is a table illustrating the effect on transmitted data of using an approach consistent with the example shown in FIG. 3—which assumes a minimum unit of two (2).

In the table of FIG. 6, "p" indicates the bit number of the first data bits and "q" indicates the corresponding number of second data bits. The term NAC(q) indicates a maximum number of unique data values capable of being represented by the second data and "2 p" indicates the maximum number of unique values capable of being represented by the first data.

For example, when the first data is constructed of 4-bits (p), the maximum number of unique values represented by the first data is 16. The corresponding 7-bit (q) second data bits is also capable of representing 16 unique values. However, when the 8-bit (p) first data is used 256 values may be represented. The corresponding 13-bit (q) second data may represent 288 values. Thus, the second data may always represent at least as many unique values as its corresponding first data, and in some embodiments more.

FIG. 6 illustrates a case wherein the minimum unit is two (2), but if the minimum unit is 3, 4 or more, the following three expressions may be used to develop analogous information in terms of minimum unit size (MU).

For $q<MU$ (e.g., 2, 3, 4), it becomes '$NAC(q)=0$'

For $MU \leq q < 2MU$, it becomes '$NAC(q)=2$'

For $2MU \leq q$, it becomes $$'NAC(q) = \sum_{k=1}^{M} NAC(q-k)'$$

Using again the example illustrated in FIG. 3, in which a minimum unit of two (2) and a corresponding q of 7 are used, the foregoing equations may be verified. That is, when the bit number of first data is 4 and the bit number of second data is 7, the third expression described above is applied thereto as the minimum unit MU is 2 and q is 7. Thus it becomes 'NAC(7)=NAC(6)+NAC(5)=NAC(5)+NAC(4)+NAC(4)+ NAC(3)=NAC(4)+NAC(3)+NAC(3)+NAC(2)+NAC(3)+ NAC(2)+NAC(3)=5*NAC(3)+3*NAC(2)=8*2=16'. The other examples may be similarly derived.

Those of ordinary skill in the art will note from FIG. 6, the resulting availability of relatively more bandwidth which may be used for the purposes noted above. In the context of a data transmission system including semiconductor memory devices, this "additional bandwidth" may be allocated to data bits associated with certain operation related commands of constituent control signals, such as read/write signals, a precharge signal, a reset signal, etc.

FIGS. 7, 8 and 9 provide comparison data for rates, transmission speeds etc. associated with the conventional transmission of first data verses the illustrated transmission of compressed second data. This data is shown for a variety of bit numbers and/or minimum unit sizes.

FIG. 7 includes such data for a case assuming a minimum unit of two (2). As shown in FIG. 7, when 4-bit first data and 7-bit second data are assumed, transmission time is shortened by 12.5%, and the data transmission rate increased by 14.3%. When 8-bit first data and 13-bit second data is assumed, transmission time is shortened by 18.75%, and the data transmission rate is increased by 23.1%. When 16-bit first data and 25-bit second data is assumed, transmission time is shortened by 21.875% and the data transmission rate is increased by 28.0%. When 32-bit first data and 48-bit second data is assumed, transmission time is shortened by 25.0% and the data transmission rate is increased by 33.3%. Thus, as the number of data bits increases in this example, transmission speed and data transmission rates improve.

FIG. 8 similarly illustrates a case assuming a minimum unit of three (3), and FIG. 9 illustrates a case assuming a minimum unit of four (4).

Corresponding reductions in power consumption due to reduced (worse case) flip-flop toggles may be similarly calculated under conventionally understood assumptions.

Embodiments of the invention provides relatively more data bits during a given transmission period. As a result, additional data bits associated with command signals and/or error correction coding may be added to the transmitted data. The data is, therefore, more robust and reliable over conventionally provided data under the same assumptions.

It will be apparent to those skilled in the art that modifications and variations can be made to the foregoing without removing such from the scope of the present invention as defined by the following claims.

What is claimed is:

1. A data transmission system, comprising:
    a data converter converting N-bit first data to be transmitted into M-bit second data, wherein M is greater than N, N is an even number and M is an odd number, and the second data is arranged in a minimum unit greater than 1, each minimum unit including at least successive data bits having the same phase;
    a transmitter compressing the second data prior to transmission via a channel having performance characteristics defining a minimum pulse width;
    a receiver receiving and de-compressing the transmitted second data; and
    a data restoring unit receiving the second data from the receiver and restoring the first data from the received second data,
    wherein following compression by the transmitter, a number of data bits in the second data equal to the minimum unit is transmitted during a time period (T) defined by an inverse of the minimum pulse width, and
    wherein an effective data transmission rate of the first data via the channel during the time period (T) is greater than the inverse of the minimum pulse width.

2. The transmission system of claim 1, wherein N is 4, M is 7, and the minimum unit is two (2).

3. The transmission system of claim 1, wherein N is 4, M is 13 and the minimum unit is four (4).

4. A data transmission system, comprising:
    a data converter converting N-bit first data to be transmitted into M-bit second data, wherein M is greater than N, N is an even number and M is an odd number, and the second data is arranged in a minimum unit greater than 1, each minimum unit including at least successive data bits having the same phase;
    a transmitter compressing the second data prior to transmission via a channel having performance characteristics defining a minimum pulse width;
    a receiver receiving and de-compressing the transmitted second data; and
    a data restoring unit receiving the second data from the receiver and restoring the first data from the received second data,
    wherein additional data bits associated with the first data are combined with the second data prior to transmission by the transmitter, and
    wherein the additional data bits comprise data bits associated with an operational command related to the first data and the receiver comprises a memory device responsive to the operational command.

5. In a system comprising a transmitter, channel and receiver, a data transmission method comprising:
    converting N-bit first data to be transmitted via the channel into M-bit second data, wherein M is greater than N, N is an even number and M is an odd number, and the second data is arranged in a minimum unit greater than 1, each minimum unit including at least successive data bits having the same phase;
    compressing the second data in the transmitter;
    transmitting the compressed second data via the channel having performance characteristics defining a minimum pulse width;
    receiving and de-compressing the transmitted second data in the receiver; and
    restoring the first data from the de-compressed second data,
    wherein compressing the second data results in a number of data bits equal to the minimum unit being transmitted during a time period (T) defined by an inverse of the minimum pulse width, and
    wherein an effective data transmission rate of the first data via the channel during the time period (T) is greater than the inverse of the minimum pulse width.

6. The method of claim 5, wherein N is 4, M is 7, and the minimum unit is two (2).

7. The method of claim 5, wherein N is 4, M is 13 and the minimum unit is four (4).

8. In a system comprising a transmitter, channel and receiver, a data transmission method comprising:
    converting N-bit first data to be transmitted via the channel into M-bit second data, wherein M is greater than N, N is an even number and M is an odd number, and the second data is arranged in a minimum unit greater than 1, each minimum unit including at least successive data bits having the same phase;
    compressing the second data in the transmitter;
    transmitting the compressed second data via the channel having performance characteristics defining a minimum pulse width;
    receiving and de-compressing the transmitted second data in the receiver;
    restoring the first data from the de-compressed second data; and
    combining additional data bits associated with the first data with the second data prior to transmission,
    wherein the additional data bits comprise data bits associated with an operational command related to the first data and the receiver comprises a memory device responsive to the operational command.

* * * * *